(12) United States Patent
Kopf et al.

(10) Patent No.: US 9,560,772 B2
(45) Date of Patent: Jan. 31, 2017

(54) ELECTRIC CIRCUIT CONFIGURATION HAVING AN MID CIRCUIT CARRIER AND A CONNECTING INTERFACE CONNECTED TO IT

(75) Inventors: Stefan Kopf, Pfalzgrafenweiler (DE); Hartmut Rohde, Waltenhofen (DE)

(73) Assignee: Robert Bosch GmbH, Stuttgart (DE)

( * ) Notice: Subject to any disclaimer, the term of this patent is extended or adjusted under 35 U.S.C. 154(b) by 1247 days.

(21) Appl. No.: 12/674,129

(22) PCT Filed: Jul. 18, 2008

(86) PCT No.: PCT/EP2008/059484
§ 371 (c)(1),
(2), (4) Date: Dec. 30, 2010

(87) PCT Pub. No.: WO2009/030553
PCT Pub. Date: Mar. 12, 2009

(65) Prior Publication Data
US 2011/0083894 A1 Apr. 14, 2011

(30) Foreign Application Priority Data
Sep. 4, 2007 (DE) .......................... 10 2007 041 892

(51) Int. Cl.
*H05K 1/11* (2006.01)
*H05K 1/18* (2006.01)
(Continued)

(52) U.S. Cl.
CPC ............ *H05K 3/368* (2013.01); *H01R 12/714* (2013.01); *H05K 1/119* (2013.01); *H05K 1/181* (2013.01);
(Continued)

(58) Field of Classification Search
CPC ...... H05K 1/119; H05K 3/368; H05K 1/0284; H05K 3/321; H05K 3/4007; H05K 2201/09045; H05K 2201/09118; H05K 2201/10393; H05K 5/0217; H05K 7/1069; H05K 2201/10151; H05K 9/0022; H05K 3/101; H05K 1/103; H05K 2201/10613; H05K 3/0014; H05K 1/14; H05K 1/141; H05K 1/144; H05K 1/18; H05K 1/181; H05K 3/36; H05K 3/336; H01R 12/714; H01R 13/405

See application file for complete search history.

(56) References Cited

U.S. PATENT DOCUMENTS 5,081,520 A * 1/1992 Yoshii et al. ................. 257/702
5,579,207 A * 11/1996 Hayden .............. H01L 25/0657
174/261

(Continued)

FOREIGN PATENT DOCUMENTS

CN 1185232 6/1998
DE 10 2005 015109 10/2005

(Continued)

*Primary Examiner* — Ishwarbhai B Patel
(74) *Attorney, Agent, or Firm* — Norton Rose Fulbright US LLP; Gerard Messina

(57) ABSTRACT

An electric circuit configuration having an MID circuit carrier and a connecting interface, the connecting interface being situated on a surface of the MID circuit carrier. The electric circuit configuration further includes at least one electrical contact pair having at least one connecting interface contact element and at least one MID contact element that is provided on the surface and is situated on the connecting interface contact element. The exemplary embodiments and/or exemplary methods of the present invention further relates to a contact element group having at least one electrical contact element for the electrical contacting of an MID circuit carrier, which is developed on a surface of an MID circuit carrier, is electrically connected to it, and extends away from the surface. The at least one (Continued)

contact element is connected to a line element of the MID circuit carrier.

20 Claims, 1 Drawing Sheet

(51) Int. Cl.
*H05K 3/36* (2006.01)
*H01R 12/71* (2011.01)
*H01R 13/405* (2006.01)
*H05K 1/02* (2006.01)
*H05K 3/32* (2006.01)
*H05K 3/40* (2006.01)

(52) U.S. Cl.
CPC ........... *H01R 13/405* (2013.01); *H05K 1/0284* (2013.01); *H05K 3/321* (2013.01); *H05K 3/4007* (2013.01); *H05K 2201/09045* (2013.01); *H05K 2201/09118* (2013.01); *H05K 2201/10393* (2013.01)

(56) References Cited

U.S. PATENT DOCUMENTS

| | | | |
|---|---|---|---|
| 5,831,832 A * | 11/1998 | Gillette et al. | 361/760 |
| 6,249,048 B1 * | 6/2001 | Heerman et al. | 257/701 |
| 7,613,010 B2 * | 11/2009 | Ono et al. | 361/784 |
| 7,696,001 B2 * | 4/2010 | Nuechter et al. | 438/106 |
| 7,732,915 B2 * | 6/2010 | Dangelmaier et al. | 257/704 |
| 2005/0194685 A1 * | 9/2005 | Weiblen et al. | 257/738 |
| 2006/0220258 A1 | 10/2006 | Nuechter et al. | |
| 2007/0001664 A1 * | 1/2007 | Steinbrink et al. | 324/174 |
| 2007/0044998 A1 * | 3/2007 | Chan | H05K 1/111 174/260 |

FOREIGN PATENT DOCUMENTS

| | | |
|---|---|---|
| DE | 20 2004 020759 | 4/2006 |
| FR | 2 857 782 | 1/2005 |
| JP | H06-501816 A | 2/1994 |
| JP | H08-31870 A | 2/1996 |
| JP | 2006-287234 | 10/2006 |
| JP | 2006-332799 | 12/2006 |
| JP | 2007-35845 | 2/2007 |
| WO | 03/079499 | 9/2003 |

* cited by examiner

ELECTRIC CIRCUIT CONFIGURATION HAVING AN MID CIRCUIT CARRIER AND A CONNECTING INTERFACE CONNECTED TO IT

FIELD OF THE INVENTION

The present invention relates to electric connections using printed circuit boards and electric connections using injection-molded circuit carriers, MID's.

BACKGROUND INFORMATION

The use of printed circuit boards, PCB's, is a standard method for connecting electrical components. The connections are specified by printed circuit traces which run on a surface of a planar printed circuit board. Printed circuit boards offer good protection from electrostatic discharges and have good properties with respect to electromagnetic compatibility. Printed circuit traces may provide a very dense connecting network, to be sure, but they are essentially limited to one plane, so that connections, which do not run in parallel to the printed circuit board, have to be provided using additional components or mechanical systems.

Three-dimensional printed circuit board structures may be produced using injection-molded circuit carriers, MID's, whereby a housing and a circuit carrier are made into one. Based on the production method, MID substrates are only able to produce simple circuit structures having few components and a low area concentration. Through-hole plating is possible only in limited fashion. If injection-molded circuit carriers are used, further miniaturizations are possible, especially in the case of circuits having three-dimensional elements, such as measuring sensors or electric contact devices.

According to the related art, particularly because of the different properties, production processes and application possibilities, are used separately from each other as circuit carrier. Since MID is a very recent technology, no usual connecting mechanical systems are known that have a low degree of complexity.

SUMMARY OF THE INVENTION

Using the circuit configuration according to the present invention and the contact element group according to the present invention, it is possible to combine with one another injection-molded circuit carriers and printed circuit boards, using a simple technique and usual, known methods, without using costly external connecting elements. Owing to the combination, one may achieve that an electric circuit configuration unites the advantages of both the injection-molded circuit carriers, MID (molded interconnect devices) and the printed circuit boards, PCB (printed circuit board), so that three-dimensional circuit configurations, as are possible using MID, may be produced having a high interconnection configuration density and a high component density, as may be provided using PCB technique, using simple, already known production processes.

The circuit configuration according to the present invention is not limited only to the combination of MID and printed circuit boards, but rather, the invention makes possible the combination of MID with any electrical components of contact elements which have a connecting interface that is situated on a surface. Furthermore, however, particularly those printed circuit boards are regarded as being electrical components or contact elements which include a connecting interface, none of the features and specific embodiments shown being intended to be restricted only to the combination of printed circuit boards and MID. In each of the specific embodiments and features described, instead of, or in combination with a printed circuit board, at least any electrical component or contact element desired may also be provided, which has a connecting interface that may be situated on a surface. The surface on which, or at which at least one connecting interface is situated may be planar or have a maximum slope difference of 180° among all surface elements.

Moreover, for the contacting of printed circuit boards of the electric circuit configuration according to the present invention, no additional sequential processes, such as wire bonding or soldering on of contacts are required, and also no additional mechanical plug connections are required, which require both additional volume and additional production complexity. In particular, in the case of multi-layer printed circuit boards, the layout surface may be utilized in optimum fashion, and a very high component density and linking density may be achieved. Furthermore, the abovementioned advantages of printed circuit board technology may also be transferred to the electric circuit configuration, without one's having to accept the disadvantages. The method particularly makes possible a simple and cost-effective opportunity of providing a plurality of contacts between an MID circuit carrier and a connecting interface of a printed circuit board. Basically, the electric circuit configuration according to the present invention and the contact element group relate to connections of at least one MID substrate to at least one connecting interface, such as a printed circuit board, a plurality of MID substrates being able to contact a connecting interface, which includes, for example, one or more printed circuit boards, or an MID substrate being able to contact a plurality of connecting interfaces, which, for example, includes one or more printed circuit boards. Furthermore, one or several connecting interfaces and the associated elements of an MID substrate may include one or more contact pairs, each contact pair connecting at least one contact of the MID substrate to at least one contact of the connecting interface, such as a printed circuit board or a part of a printed circuit board. Based on the plurality of combination possibilities, we shall refer in widespread parts of the description, as well as in the claims, to individual circuit configurations, individual connecting interfaces and to individual MID substrates, so as not to impair clarity. However, the respective features are supposed to refer to individual or group-wise features, that are yielded by the abovementioned combination possibilities.

The concept that the present invention is based on is to connect electrically MID circuit carriers directly to a connecting interface that runs along an area or plane, via MID contact elements which are provided on a surface of the MID circuit carrier. Since, in the case of connecting interfaces of printed circuit boards or electrical components, surface-related contact elements are also involved, such MID contact elements provided on surfaces enable an uncomplicated direct electrical combination of the various technologies. Since printed circuit boards or other surface-related circuits may extend over a plane, the MID contact elements are particularly situated on a planar surface of the MID circuit carrier.

Therefore, an electric circuit configuration includes at least one electrical contact pair, which includes a connecting interface contact element and an MID contact element, the electrical connection between the various contact elements being achieved because of the low spatial separation distance. The low spatial distance is 0, for instance, if the connecting interface is located directly on the surface or on the MID contact elements, intermediate elements being able to be provided also, however, which provide an electrically conducting connecting element. Such an electrically conducting connecting element may include, for instance, adhesives, layer elements or conductive films or conductive rubber. The abovementioned intermediate elements, which provide an electrically conductive connecting element, according to one exemplary embodiment, have the further purpose of making a mechanical connection between MID circuit carrier and connecting interface or printed circuit board or component carrying the connecting interface. Therefore, if a conductive adhesive is used as the conductive connecting element, which inherently also provides mechanical force-transmitting connections, such an electrically conducting connection will also achieve fastening.

In order to fasten the printed circuit board or rather, its connecting interface and the MID circuit carrier, additional, purely mechanical connecting elements may also be used, however, a mechanical connecting element may be provided between the MID circuit carrier and the printed circuit board, the component and the connecting interface, which also represents an electrically conductive connecting element, and vice versa. Such a mechanical-electrical double function may be provided for the respective connecting element, especially when using an adhesive that is conductive. Moreover, the area of the MID contact elements and the connecting interface contact elements are provided so that the connection of a maximum mechanical load holds up, even if smaller areas would be sufficient for the electrical connection. In a similar manner, the area may also be laid out according to a high current load, that is, a low contact resistance, the areas required for the mechanical connection are smaller, for instance, because of external mechanical fastening elements or a smaller mechanical load to be expected.

As mechanical connecting elements, which are not executed together with the electrical connecting elements, elastic elements, adhesive joints, welding seams, clips, crimping elements, screwing, riveting connections, snapping-in connections and the like may be used to provide a force-locking, a form-locking or a continuous material mechanical connection. These mechanical connecting elements may be developed to be conductive or nonconductive. Connecting elements which build up only one mechanical connection may be provided to have at least one elastic element, the elastic element being able to be provided by the MID circuit carrier, by the printed circuit board or the electrical component which carries the connecting interface, or by both, as well as by connecting elements which connect the MID circuit carrier and the connecting interface or the printed circuit board and the electrical component to one another.

The mechanical connecting elements may provide a constant pressure between the MID circuit carrier and the connecting interface or the printed circuit board, so that the MID circuit carrier and the printed circuit board are pressed against each other at a certain pressure. Among other things, the pressure applied is used to stabilize the electrical connection, especially in case the electrical connection is not a continuous material connection.

The electrical connection produced by the electrical connecting elements connects the MID contact elements to the respectively associated connecting interface contact elements. The MID contact elements may be connected directly to the line elements of the MID circuit carrier, such line elements providing the interconnection within the MID circuit carrier. Such line elements are developed, for instance, from a conductive layer which is provided with a pattern, according to the desired interconnection. In the same way, the connecting interface contact elements are specially formed sections of a conducting layer which may be provided on one of the outer surfaces of the printed circuit board. Generally, connecting interface contact elements may be surface contact elements of an electrical component which are developed along an area or a surface. The area may be curved, but may be planar.

A printed circuit board is usually coated with a copper layer whose development defines the electrical interconnection within the printed circuit board. The printed circuit board as well as the MID circuit carrier may have more layers, such as intermediate layers, which are only provided for the interconnection within the MID circuit carrier and the printed circuit board, additional electrical connecting elements producing the contact to the respective contact elements, for instance, a through-hole plating in the printed circuit board.

In order to provide a homogeneous electrical connection, both at least one printed circuit board section and a section of an electrical component, the connecting interface contact element and the surface of the MID circuit carrier are developed in complementary fashion to one another, in order further to provide the common arrangement of all contact elements of the electric circuit configuration. On printed circuit boards, since the connecting interface contact elements extend only slightly (less than 0.1 mm) away from the printed circuit board, the MID contact element may be developed in such a way that it extends away from the MID circuit carrier and along a direction leading to the printed circuit board or to the connecting interface. The MID contact elements formed in this way, which extend away from the MID circuit carrier, thus create sufficient distance between the MID circuit carrier and the printed circuit board to avoid or to reduce undesired contacting or capacitive coupling or inductive coupling.

The MID contact elements extending outwards (that is, in a direction leading away from the MID circuit carrier) may be produced in the same way as the three-dimensional form of the MID circuit carrier is characterized, for instance, by plastic deformation at elevated temperature or by stamping. A hemisphere may be used as the shape of the MID contact elements, which remain stable even at higher mechanical loads. Depending on the desired electrical and elastic-mechanical properties, the MID contact element may extend away from the MID circuit carrier having a constant cross section or having a constant cross sectional surface, or it may taper toward the connecting interface. Accordingly, a form is particularly suitable which only extends in a direction pointing away from the MID circuit carrier, i.e. a cylinder, a cone, a frustum of a cone, a pyramid, a frustum of a pyramid, having respective cross sections, such as circular, oval, square, rectangular, polygonal or a mixed shape of these.

The cross section and particularly the degree of taper of the MID contact element have an effect on the mechanical properties, particularly on the elastic properties of the MID contact element, especially if the MID circuit carrier, and thus also the MID contact element produced in one part with it, are made of a material having elastic properties. Likewise, shapes may be used which extend in a direction pointing away from the MID circuit carrier as well as along a direction extending parallel to the MID circuit carrier, for instance, a cylinder whose axis extends parallel to the MID circuit carrier and has a cross section that is semicircular, semielliptical, square, trapezoidal or rectangular. The cross section of the cylinder running parallel to the MID circuit carrier may taper in a direction which leads perpendicularly away from the MID circuit carrier.

Therefore, a material may be used as substrate for the MID circuit carrier which is not brittle at utilization temperatures and has at least partially elastic properties and suitable plastic properties, for three-dimensional shaping, the material being furthermore easily plastically deformable at higher temperatures or attaining flow properties.

The concept underlying the present invention is not only implemented by an electric circuit configuration having an MID circuit carrier, a connecting interface and a corresponding electrical contact pair, but also by a contact element group that is situated on an MID circuit carrier. According to the present invention, such a contact element group extends away from the surface of the MID circuit carrier, is connected electrically to at least one line carrier element or at least one component within the MID circuit carrier, and based on the physical arrangement, is suitable for being connected to a connecting interface, in that the connecting interface having respective connecting interface contact elements is brought onto the corresponding associated surface of the MID circuit carrier, which carries the contact elements. As is also the case in the electric circuit configuration according to the present invention, the surface of the contact element group that is provided on the MID circuit carrier is only one surface of a plurality of surfaces of the MID circuit carrier, and it may extend in a planar manner. The surface that may extend in a planar manner particularly carries the electrical contact elements of the MID circuit carrier and is equivalent to a part of the overall surface of the MID circuit carrier. That is why portions of the overall surface of the MID circuit carrier which carry no MID contact element are not limited to any shape, and are thus able to be adapted physically to the corresponding requirements. Surface parts are especially possible which carry no MID contact element and which are developed not to be planar, or to be on a surface having a maximum overall curvature of 180°. Consequently, the contact group forms an interface of the MID circuit carrier to the contact areas of a printed circuit board or another contact device of any electrical components that run along a plane, which provide the connecting interface.

The MID contact element may therefore be connected to an electrical component of the MID circuit carrier or to a line element of the MID circuit carrier. For the electrical conduction, the MID contact element may be connected by force locking, by form locking or by continuous material to one or to a plurality of line elements of the MID circuit carrier, or may be developed in one part with one or a plurality of line elements of the MID circuit carrier. The three-dimensional design possibilities of an MID circuit carrier, in particular, make possible the simple stamping of the MID contact elements, the MID contact elements being able to be developed in the same process in which the shape of the MID circuit carrier is formed.

The concept according to the present invention, may basically be used for connecting MID circuit carriers and any desired contact arrangements of any electrical components, that is, also those that are shaped in any desired manner. Therefore the MID contact elements must basically be positioned in a complementary fashion to the respective contact elements of the electrical components. However, the area may be defined by the MID contact elements and the contact arrangement has no undercuts, that is, it has a maximum overall curvature of less than 180° and may have a regular or rather elementary geometrical shape.

Exemplary embodiments of the present invention are shown in the drawings and explained in greater detail in the following description.

DETAILED DESCRIPTION

Figure 1:
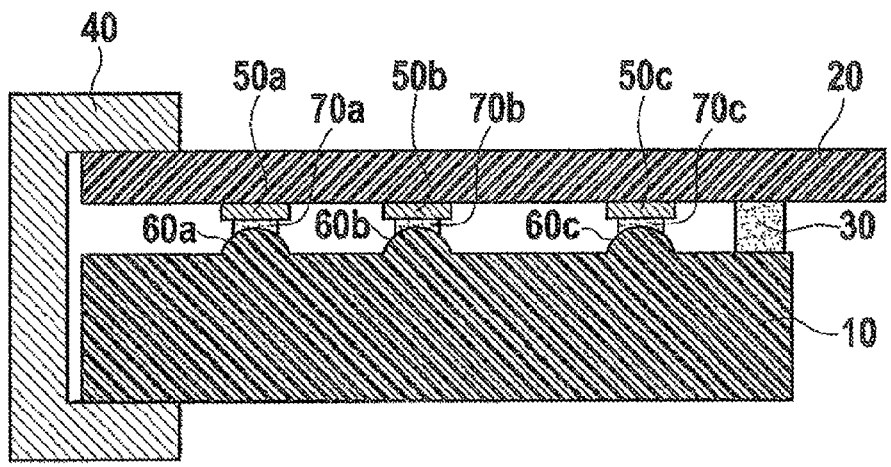
FIG. 1 shows an electric circuit configuration, according to the present invention, in cross section

FIG. 1 shows an electric circuit configuration which includes a planar connecting interface 20 and an MID circuit carrier 10. Connecting interface 20 is connected to MID circuit carrier 10 via three individual contact pairs P, each contact pair producing a single electrical connection, which is separate from the electrical connections of the other electric contact pairs P. In FIG. 1, connecting interface 20 is developed by an insulating carrier or by a substrate and a copper outer layer situated on it, which form a printed circuit board. The copper outer layer forms contact areas or pads, which may be developed in one part with printed circuit boards (not shown).

Each electric contact pair includes a connecting interface contact element, an electrical contact element which includes conductive material, for example, conductive adhesive material, as well as MID contact elements 60a-c. The electrical connecting element, which in FIG. 1 is made of a conductive adhesive material, is shown in a hatched manner. Solder may also be used instead of adhesive material, which may be an applied solder paste which is heated using reflow technique. MID contact elements 60a-c are situated on a planar surface of MID circuit carrier 10, which face the connecting interface. Furthermore, the electric circuit configuration shown in FIG. 1 includes additional, purely mechanical connecting elements 30, 40, mechanical connecting element 30 representing an adhesive joint between the connecting location and the MID circuit carrier. Adhesive joint 30 is provided particularly between the surfaces of the MID circuit carrier and the connecting interface (of the printed circuit board, that is), that face each other. Moreover, reference numeral 40 refers to an alternative mechanical connecting element that is developed as a spring element or as a clip. Because of the form-locking design, a press fit is created, which presses the connecting interface onto the MID contact element and thus onto the MID circuit carrier.

A similar force is brought to bear by adhesive joint 30, adhesive location 30 exerting a corresponding tensile force on connecting interface 20 and MID circuit carrier 10. Furthermore, connecting elements a-c, which are formed as conductive adhesive material, are simultaneously able to produce a mechanical connection which is also used to fasten connecting interface 20 to MID circuit carrier 10. Consequently, connecting elements 70a-c form mechanical connecting elements at the same time.

Connecting interface 20 is developed as a nonconductive carrier, on which conducting contact fields 50a-c are situated. Contact fields 50a-c have corresponding or complementary opposite correspondences which are provided by MID contact elements 60a-c. A printed circuit board or a printed circuit board section, that extends in a planar manner, may be used as connecting interface 20, contact fields 50a-c being formed by corresponding formations of the printed circuit board or a conductive outer layer of the printed circuit board.

The connecting interface contact elements may also, in general, be the end faces of contact pins, for example, the contact pins being fastened to a common carrier, for instance to a component, a module or the like. The connecting interface contact elements may therefore project from a common carrier or may project only insubstantially from a common carrier, as is so in the case of a printed circuit board, and may terminate flush with a carrier surface, for example, in the case of a planar pattern like a chip.

Connecting interface 20 may further carry additional electric or electronic components (not shown in FIG. 1). In particular, a printed circuit board may be provided, as connecting interface 20, which additionally includes at least one circuit, and therefore carries corresponding circuit elements and components. The connections between the components may be provided by printed circuit board coatings or printed circuit board linings, using which contact fields 50 are also developed. At least a few of the components and connections may be connected to contact fields 50.

Figure 2:
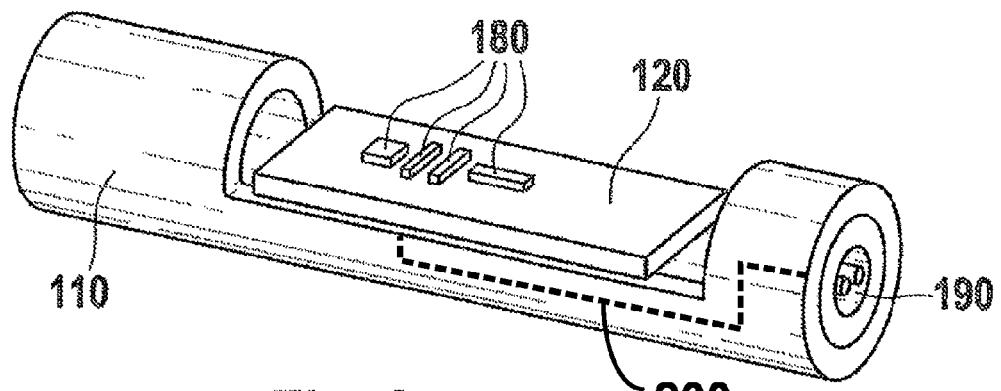
FIG. 2 shows an isometric representation of an additional electric circuit configuration according to the present invention.

FIG. 2 shows a composite structure according to the present invention, in isometric representation. The composite structure shown includes an electric circuit configuration according to the present invention, having an MID circuit carrier 110 and a component which includes a connecting interface in the form of a printed circuit board 120, the printed circuit board further carrying electrical or electronic components 180, which are developed as SMD components or as through-hole components. The lower side of printed circuit board 120, that is not shown, carries corresponding contact fields which are opposite respective MID contact elements. At its lower side, the printed circuit board may be connected to MID circuit carrier 10, the MID circuit carrier having a cylindrical base shape from which a half cylinder of lesser height has been removed, so that a part of the overall surface of the MID circuit carrier is a planar surface onto which the printed circuit board is able to be positioned in coplanar fashion, in 110.

The MID circuit carrier also includes a head end at which connecting means are applied which are developed, for instance, as a plug, a socket, solder pins or as a plug connector.

According to one particular embodiment of the present invention, at least one component of components 180 is a pressure sensor, a complex section for data processing being accommodated on printed circuit board 120, and the connections to the outside are provided via a contact element group according to the exemplary embodiments and/or exemplary methods of the present invention, which produces the contact to the MID circuit carrier which, in turn, is used as transmission medium to a further external interface 190, e.g., with MID contact elements being electrically connected to external interface 190 via a line 200. The MID circuit carrier in this case offers extensive mechanical protection as well as stable fastening for the circuit accommodated on printed circuit board 120, connecting means 190, situated at the head end, being used for mechanical as well as electrical connections to external devices.

Usually, in general, as well as in particular in devices as shown in FIG. 2, the contacts according to the exemplary embodiments and/or exemplary methods of the present invention are implemented as strip-shaped elevations in the MID circuit carrier, which form the MID contact elements, and by printed circuit board-contact elements which correspond to the MID contact elements. The printed circuit board-contact elements may also be developed as unidimensional contact elements or may be implemented in planar fashion.

Figure 3:
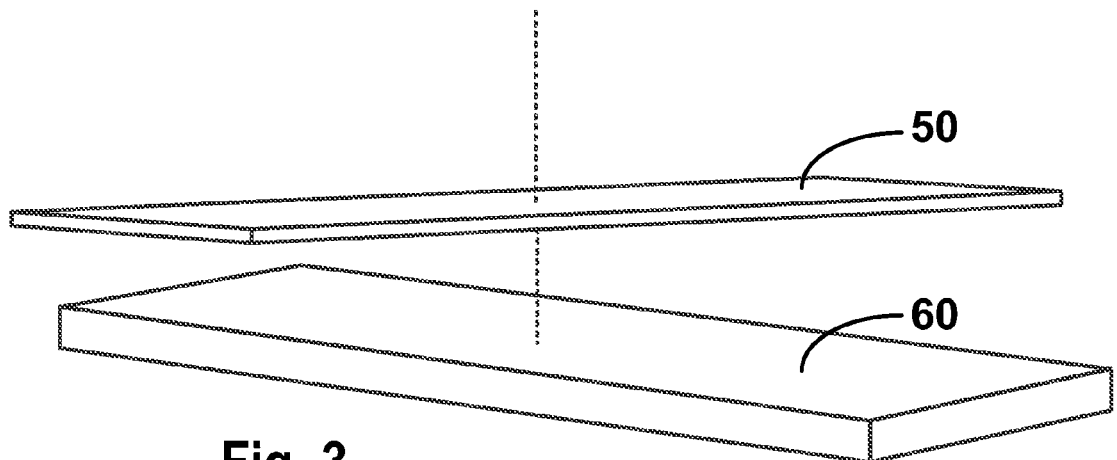
FIG. 3 shows an arrangement of an MID contact element and a printed circuit board-contact element developed as strips longitudinally extending in perpendicular directions, according to an example embodiment of the present invention.

According to one embodiment of the present invention, both the MID contact element and the printed circuit board-contact element are developed as strips which, however, extend in different directions, such as at a 90° angle to one another, e.g., as schematically shown in FIG. 3, in which the MID contact element is shown to be shaped such that all its cross-sections along an axis extending perpendicularly to the substrate surface would be the same and all its cross-sections along an axis extending parallel to the substrate surface would be the same. Exactly defined contact points come about because of this crossing, so that the contact resistance between the two contact elements is essentially independent of the positioning.

In FIG. 2, the contact elements of the MID circuit carrier and the contact elements of the printed circuit board are in each case adhered to one another. The respective adhesion joint is generated by applying a certain quantity of conductive adhesive material either to the printed circuit board contact elements, to the MID contact elements or to both, so that, during the mounting of the printed circuit board onto the MID circuit carrier, the adhesive material is distributed in such a way that a reliable electrical (and mechanical) connection is created between the respective contact elements, and at the same time it is prevented that adjacent MID contact elements or adjacent printed circuit board contact elements become electrically connected to one another by spreading adhesive material. This undesired electrical contacting of the contact elements to one another is correspondingly avoided by the material selected as well as by the distance of the MID contact elements or the printed circuit board-contact elements from one another.

According to one additional embodiment of the present invention, the MID circuit carrier as shown, for instance, in FIG. 2, includes two outer traversing MID contact elements which extend along the entire planar surface parallel to the cylinder axis, and which, besides the electrical and the mechanical contact formation to the respective printed circuit board-contact elements, also provide an overflow protection which, when the printed circuit board is mounted on the MID circuit carrier, prevents the spreading adhesive material or the applied solder paste from spreading outside the surface provided for this.

The MID circuit carrier, shown in FIG. 2, includes a section, shown on the left side in FIG. 2, in which the MID circuit carrier has a round cross section, and is developed as a hollow cylinder. Because of the development as a hollow cylinder, electrical, mechanical and fluidic connecting possibilities come about all the way through the hollow cylinder to the printed circuit board, such connections being able to be used to connect the sensor, accommodated on printed circuit board 120, in a fluid connection or at least in a manner transmitting pressure, to external volumes. In the same way, the printed circuit board may carry a temperature sensor which is able to record the temperature of external volumes via the fluid connection.

According to an additional embodiment, the MID circuit carrier, shown in FIG. 2, along the longitudinal section in which the MID circuit carrier is developed as a half-cylinder, is provided having a lesser radius, so that, at the height of the printed circuit board, or the surface provided for it, an offset comes about in the direction of the longitudinal axis of the cylinder. This offset may be used to insert housing elements that protect the printed circuit board, the wall thickness of such housing elements being able to be compensated for by the lesser radius, so that such a housing element does not project beyond the outer surface of the full cylinder section of the MID circuit carrier, or only slightly so.

What is claimed is:

1. An electric circuit configuration, comprising:
   a molded interconnect device ("MID") circuit carrier formed of a substrate that is shaped into a shape that includes at least one projection in an entirety of which a thickness of the substrate is greater than a thickness of the substrate surrounding the respective projection, the at least one projection being an at least one electrically conductive MID contact element that extends away from a surface of the substrate surrounding the respective MID contact element;
   an electrical connecting interface arranged over the carrier; and
   at least one connecting interface contact element, each of which extends in a direction from the electrical connecting interface towards the carrier, and is paired with, and positioned opposite to, a respective one of the at least one MID contact element to form a respective electrical contact pair;
   wherein the connecting interface contact element and the MID contact element of at least one of the electrical contact pairs are formed as strips arranged such that their longitudinal axes extend perpendicular to each other and in planes parallel to surfaces of the carrier and the connecting interface that face each other.

2. The electric circuit configuration of claim 1, wherein the connecting interface contact element is located directly on the connecting interface, and the MID contact element is in or on the surface of the MID circuit carrier, and wherein the MID contact element extends all the way to the connecting interface contact element, the connecting interface contact element extends all the way to the MID contact element, or the connecting interface contact element and the MID contact element each extend all the way to each other.

3. The electric circuit configuration of claim 1, wherein at least one of the electrical contact pairs also has an electrically conductive connecting element, which is situated between the connecting interface contact element and the MID contact element and electrically connects these to each other.

4. The electric circuit configuration of claim 3, wherein the electrical contact pair includes a mechanical connecting element, which connects the connecting interface contact element and the MID contact element mechanically to each other in a force-transmitting manner, wherein the mechanical connecting element is in one part with the electrically conductive connecting element, or the mechanical connecting element is physically separate from the electrically conductive connecting element.

5. The electric circuit configuration of claim 4, wherein the electrical connecting element includes an isotropically or an anisotropically conductive adhesive material, a conductive paste, an isotropically or an anisotropically conductive film or an isotropically or an anisotropically conductive semiconducting rubber or an elastic plastic material that is electrically conductive.

6. The electric circuit configuration of claim 1, further comprising:
   at least one mechanical force-locking, form-locking or continuous material connecting element, which is conductive or nonconductive as one of an elastic element, an adhesive joint, a clip, and a crimping element.

7. The electric circuit configuration of claim 1, wherein the connecting interface, the connecting interface contact element and the surface of the MID circuit carrier extend essentially in a coplanar manner with respect to each other.

8. The electric circuit configuration of claim 1, wherein the MID contact element strip runs along the surface of the MID circuit carrier and has a constant elevation height with respect to the surface of the MID circuit carrier.

9. The electric circuit configuration of claim 1, wherein the at least one electrically conductive MID contact element is electrically connected to a line element of the MID circuit carrier and is configured for electrically connecting the MID circuit carrier to another device.

10. The electric circuit configuration of claim 9, wherein the at least one MID contact element is connected to the line element of the MID circuit carrier in an electrically conductive manner and is (a) connected by force locking, form locking or continuous material to the line element of the MID circuit carrier, or (b) one part with the line element of the MID circuit carrier.

11. The MID of claim 9, wherein all cross-sections of the MID contact element along an axis extending perpendicularly to the substrate surface are the same.

12. The MID of claim 9, wherein all cross-sections of the MID contact element along an axis extending parallel to the substrate surface are the same.

13. The electric circuit configuration of claim 1, wherein the electrical connecting interface is or is part of a printed circuit board (PCB).

14. The electric circuit configuration of claim 1, wherein all cross-sections of the MID contact element along an axis extending perpendicularly to the substrate surface are the same.

15. The electric circuit configuration of claim 1, wherein all cross-sections of the MID contact element along an axis extending parallel to the substrate surface are the same.

16. The electric circuit configuration of claim 1, wherein the extension of the at least one MID contact element away from the surface of the substrate surrounding the respective MID contact element is towards the electrical connecting interface and provides a separation distance between MID circuit carrier and the electrical connecting interface, the separation distance being sufficient to avoid physical contact, and at least one of capacitive and inductive coupling, between the MID circuit carrier and the electrical connecting interface.

17. The electric circuit configuration of claim 1, wherein the shaping of the substrate is by deformation.

18. The electric circuit configuration of claim 1, wherein the shaping of the substrate is by stamping.

19. An electric circuit configuration, comprising:
    a molded interconnect device ("MID") circuit carrier formed of a substrate that is shaped into a shape that includes at least one projection in an entirety of which a thickness of the substrate is greater than a thickness of the substrate surrounding the respective projection, the at least one projection being an at least one electrically conductive MID contact element that extends away from a surface of the substrate surrounding the respective MID contact element;
    an electrical connecting interface; and at least one connecting interface contact element, each of which is paired with, and positioned opposite to, a respective one of the at least one MID contact element to form a respective electrical contact pair;

wherein the connecting interface contact element and the MID contact element of each of at least one of the electrical contact pairs are formed as strips whose longitudinal axes are oriented so that they extend in different directions and in different planes that are parallel to each other, so that the strips of the respective contact pair overlap each other at corresponding points of their respective planes of extension, to thereby establish a contact resistance between the contact elements of the respective pair.

20. The electric circuit configuration of claim 19, wherein the longitudinal axes of the strips of the respective pair are oriented perpendicular to each other.

* * * * *